United States Patent [19]

Roemer

[11] Patent Number: 5,086,275
[45] Date of Patent: Feb. 4, 1992

[54] TIME DOMAIN FILTERING FOR NMR PHASED ARRAY IMAGING

[75] Inventor: Peter B. Roemer, Schenectady, N.Y.

[73] Assignee: General Electric Company, Schenectady, N.Y.

[21] Appl. No.: 570,247

[22] Filed: Aug. 20, 1990

[51] Int. Cl.⁵ .......................................... G01R 33/20
[52] U.S. Cl. .................................. 324/309; 324/318; 324/322
[58] Field of Search .............. 324/300, 307, 309, 318, 324/322; 128/653 A, 653 SC, 653 R

[56] References Cited

U.S. PATENT DOCUMENTS

| | | | |
|---|---|---|---|
| 4,070,611 | 1/1978 | Ernst | 324/309 |
| 4,115,730 | 9/1978 | Mansfield | 324/309 |
| 4,588,948 | 5/1986 | Mansfield | 324/309 |
| 4,651,096 | 3/1987 | Buonocore | 324/309 |
| 4,825,162 | 4/1989 | Roemer et al. | 324/318 |
| 4,857,844 | 8/1989 | Van Vaals | 324/307 |
| 4,871,969 | 10/1989 | Roemer et al. | 324/318 |
| 4,876,507 | 10/1989 | Van Vaals | 324/307 |
| 4,876,509 | 10/1989 | Perlmutter | 324/309 |
| 4,993,075 | 2/1991 | Sekihara | 324/307 |

OTHER PUBLICATIONS

R. Hamming, "Digital Filters", Prentice-Hall, 1989, pp. 102–105.

Primary Examiner—Michael J. Tokar
Attorney, Agent, or Firm—Marvin Snyder; James C. Davis, Jr.

[57] ABSTRACT

A method and apparatus for combining NMR response data of a sample from a plurality of closely spaced RF receiver coils of an NMR phased array in the time domain to form a composite NMR image wherein each of the RF receiver coils receives a different respective one of a plurality of NMR response signals, each of which is evoked from a portion of the sample within a field of a respective one of the receiver coils. The response signals are conditioned to develop a plurality of data point signals corresponding to the magnitude of each of the respective response signals from each of the receiver coils at successive time intervals. The data point signals are convolved by a time domain representation of a field map of the respective one of the receiver coils generating the corresponding one of the response signals. The convolved signals are combined on a time domain point-by-point basis to produce a time domain representation of the composite NMR image of the sample.

11 Claims, 13 Drawing Sheets

TIME DOMAIN FILTERING FOR NMR PHASED ARRAY IMAGING

BACKGROUND OF THE INVENTION

The present invention relates to nuclear magnetic resonance (NMR) imaging and, more particularly, to methods and apparatus for combining the simultaneously received data from a plurality of radio-frequency (RF) coils of an NMR phased array in the time, rather than image, domain to produce a composite image having high signal-to-noise ratio (SNR) throughout the image.

The term "NMR phased array" refers to apparatus, such as shown in Roemer et al. U.S. Pat. No. 4,871,969 (the disclosure of which is incorporated herein by reference), wherein a plurality of closely-spaced RF coils is employed for simultaneously receiving different NMR response signals from associated portions of a sample (such as a patient in medical imaging) and combining the separate data from each coil to produce a single composite NMR image of the sample. By overlapping adjacent coils and connecting each coil to the input of an associated low-input-impedance preamplifier channel, the high SNR of a single surface coil can be maintained over fields-of-view (FOV) characteristic of remote coils.

Currently, composite images for NMR phased arrays are reconstructed in the image domain by combining the individual image contributions on a weighted, point-by-point basis after first acquiring the complete NMR images for each separate coil. The reason for acquiring the separate images first is that the optimum set of weights needed to maximize SNR when combining the separate signals to produce the composite image is a function of position, and so varies from point to point. While the phase shifters and transformers of the setup shown in FIG. 6 of Roemer et al. U.S. Pat. No. 4,825,162 can be adjusted to provide a composite image in the time domain having a high SNR at any particular point, different weighting must be applied for each point in order to obtain good sensitivity over the whole image. Thus, the conventional approach is to first separately acquire the different NMR image from each coil before combining the different individual images, on a point-by-point basis, to form the composite image.

NMR phased array imaging as described in the '162 patent, therefore, has the drawbacks of requiring large amounts of memory to store the separate coil images before reconstruction and of necessitating long time delays between acquisition of the last data point and onset of the first display of the reconstructed image.

It is desirable in NMR phased array imaging to be able to combine the data from the separate receiver coils as it is acquired on a time domain, rather than image domain, basis without sacrificing SNR resolution. Combining the data as acquired will reduce the total memory requirements of the system since only one combined data set would have to be stored and, because only the combined data set will have to be transformed at the end of scanning, will also reduce the time between end-of-scan and first appearance of the composite image.

BRIEF SUMMARY OF THE INVENTION

Among the several objects of the present invention will be noted the provision of a method and apparatus for forming a composite NMR image with high SNR throughout the image; the provision of a method and apparatus for NMR spectroscopy and NMR imaging using data combination in real time; and the provision of a method and apparatus which overcomes the aforementioned and other disadvantages of the prior art.

In accordance with the invention, a method is provided for combining the simultaneously received different NMR response signals from a plurality of closely-spaced, overlapping RF receiver coils of an NMR phased array in the time domain, to form a composite image that has high SNR throughout the image. A filter scheme is utilized to develop a composite data set in the time domain, wherein each time point of the composite data is formed on the basis of contributions from previous data points and future data points. The data is passed through filter arrangements having one-, two- and three-dimensional filters before the signals are summed together. Each filter dimension corresponds to filtering in one of the time dimensions of k-space, i.e., the readout direction; the phase encode direction; and, in the case of three-dimensional imaging, the second phase encode direction. Filter coefficients are chosen to combine the data in a way that is simultaneously optimal for providing a high SNR at multiple points of the composite image. With more terms added to the filter, the SNR can be optimized over the entire image.

In a preferred embodiment, described in greater detail below, the filter functions are determined from the RF magnetic field profiles of the receiving coils.

BRIEF DESCRIPTION OF THE DRAWINGS

Throughout the drawings, like elements are referred to by like numerals.

DETAILED DESCRIPTION OF THE INVENTION

Figure 1:
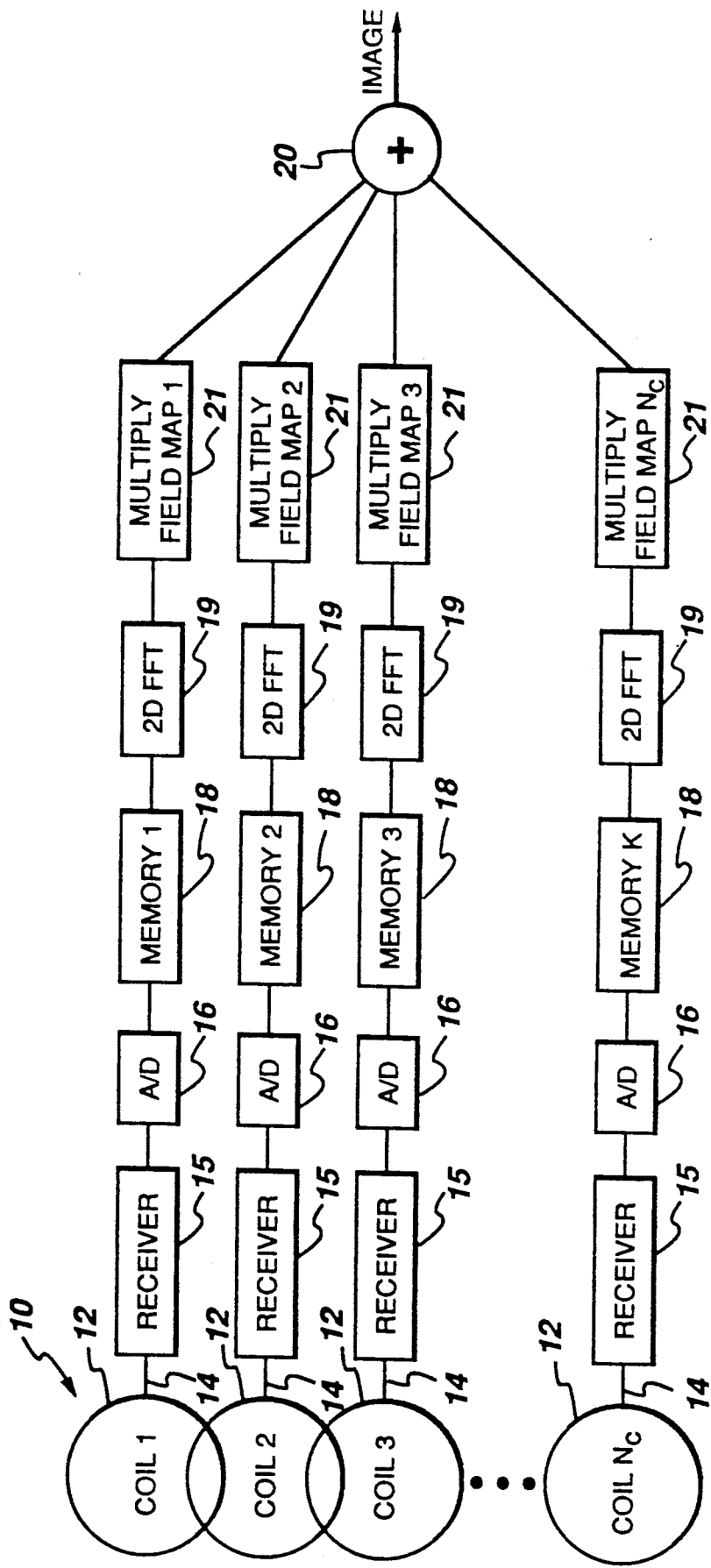
FIG. 1 (prior art) is a schematic view of an arrangement employed in the conventional method to combine the signals from the overlapping coils of an NMR phased array using image domain data processing techniques.
Figure 5:
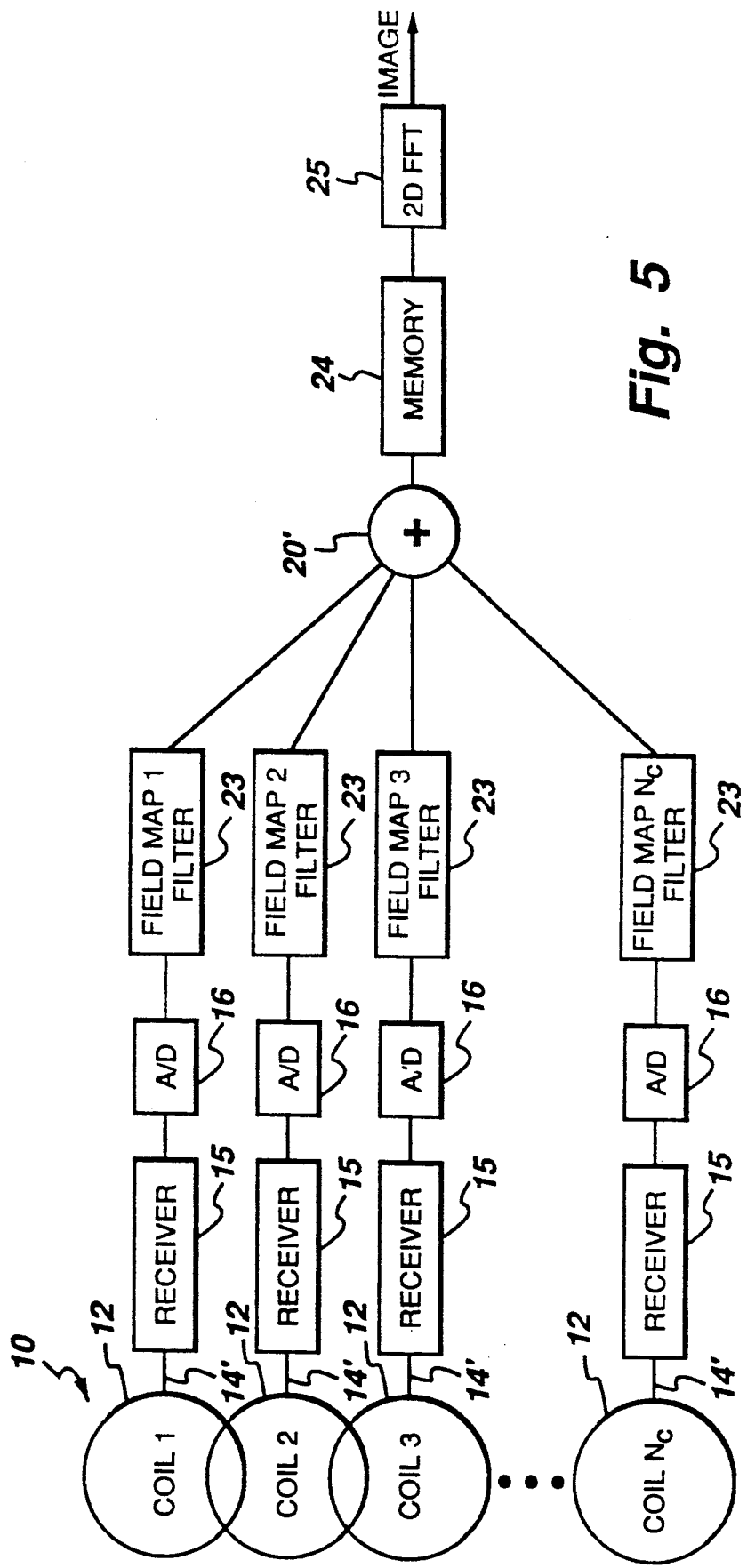
FIG. 5 is a schematic view of an arrangement employed in a method of combining the coil signals of an NMR phased array in the time domain using filters in accordance with the present invention.

FIGS. 1 and 5 show an NMR phased array 10, such as described in Roemer et al. U.S. Pat. No. 4,825,162, of a plurality of radio-frequency (RF) receiver coils 12 (coils 1 through $N_c$) defining an imaging volume for the NMR imaging of a sample, such as for the NMR medical diagnostic imaging of a human spine. The separate surface coils 12 are identically configured and are arranged in closely-spaced relationship with overlapping fields-of-view (FOV), but with substantially no interaction between adjacent coils. The coils 12 are adapted as part of the NMR imaging process to simultaneously receive a different one of a plurality of NMR response signals each evoked from an associated portion of the sample enclosed in the imaging volume. As shown, each coil 12 has its own processing channel 14 including receiver circuitry 15 and an analog-to-digital converter 16. FIG. 1 is a schematic representation of the conventional data processing set-up for constructing a different NMR image for each channel 14 of a sample portion from the NMR response signals received by the associated coil 12 for that channel 14, and for subsequently combining the plurality of different images thus constructed, on a point-by-point basis, in the image domain, to produce a single final NMR image of all sample portions from which an NMR signal was received by any of the coils 12. FIG. 5 is a schematic representation of the corresponding set-up for performing the image reconstruction in the time domain utilizing the principles of the present invention.

Combination in the Image Domain

As described in Roemer et al. U.S. Pat. No. 4,871,969, the optimal combination or weighting of signals from the individual coils $1-N_c$ in the array 10 to achieve a high signal-to-noise ratio (SNR) is dependent on the location (x, y, z) of a particular volume element (voxel). This is because the signal of each RF receiving coil $C_i$ is sensitive to nuclear spins in proportion to the field $B_i$ created by the coil, whereas the noise is "white noise" uniformly distributed over the image. Hence, the resultant SNR is a function of position.

Assume that $I_1(x,y)$ is the complex image obtained by reconstructing the data received from coil $C_i$, and $B_i(x,y)$ is the RF magnetic field produced by coil $C_i$. The real part of B is the x component (in magnet coordinates as opposed to the screen coordinates of the image) of the transverse RF magnetic field and the imaginary part of B is the y component of the field. If noise correlations are ignored (which will have little effect on image quality) and all coils 12 have approximately the same noise, the combination of separate images $I_i$ that optimizes the SNR in the composite image is given by $$I(x,y) = \sum_{i=1}^{N_c} I_i(x,y) B_i(x,y) \quad (1)$$

where I(x,y) is the composite image.

The complex image is really the product of the RF receiving coil magnetic field and the spin density S(x,y) given by $$I_i(x,y) = C\, S(x,y)\, B_i^*(x,y) \quad (2)$$

where the * denotes the complex conjugate and C is an overall scale factor. The complex conjugate enters equation (2) because increasing angles of the RF magnetic field are defined to be positive in the direction of rotation of the nuclei. Greater angles of the RF magnetic field correspond to time delays (negative phase shifts) and thus the NMR signal is proportional to the complex conjugate of the RF magnetic field.

The magnitude of I(x,y) in equation (1) can be expressed as the sum of the products of the magnitudes of the image and the magnetic field maps:

$$I(x,y) = \left| \sum_{i=1}^{N_c} I_i(x,y) B_i(x,y) \right| = \sum_{i=1}^{N_c} |I_i(x,y)| |B_i(x,y)| \quad (3)$$

Equation (3) gives a basic form usable in image reconstruction methods. Combining images using equation (3) is particularly convenient because the phase shifts of the individual receivers do not have to be known, and the image reconstruction programs do not have to carry the complex data.

FIG. 1 shows schematically the conventional process employed for combining the data in the image domain. The NMR signal from each coil $1-N_c$ is sent through its associated channel 14 for processing by its own receiver 15, digitized by its own analog-to-digital (A/D) converter 16 and stored in digital form in its own assigned memory 18. After acquisition is complete, the data from each coil channel is separately subjected to transformation by processing means 19 and then combined point-by-point into a single composite image at summation means 20 in accordance with equation (3).

Combination in the Time Domain

To derive the time domain filtering method of the present invention (FIG. 5), it was recognized that the combined image obtained using the image domain method is simply the Fourier transform of the original time dependent data. In accordance with equation (1), the optimal combination of images I(x,y) (i.e., that giving high SNR over the whole image) is obtained by multiplying each separate coil image $I_i(x,y)$ by its corresponding RF coil magnetic field map profile $B_i(x,y)$ at 21, before summing the results at 20 (see FIG. 1). From linear system theory, however, it is known that convolution in the time domain is equivalent to multiplication in the spatial domain. Thus, for a single slice of multi-slice data the time domain representation of the composite image can be given by the two-dimensional convolution integral $$A(t_r, t_\phi) = \sum_{i=1}^{N_c} \int_{-\infty}^{+\infty} \int_{-\infty}^{+\infty} b_i(\tau_r, \tau_\phi) v_i(t_r - \tau_r, t_\phi - \tau_\phi) d\tau_\phi d\tau_r \quad (4)$$

where $N_c$ is the number of coils, $v_i(t_r,t_\phi)$ is the time dependent NMR voltage signal measured on coil i, $b_i(\tau_r,\tau_\phi)$ is the inverse Fourier transform of coil i's RF field map, $A(t_r,t_\phi)$ is the inverse Fourier transform of the composite data set and $t_r$ is the readout time for each phase encode time $t_\phi$.

For a finite set of discrete samples, the inverse Fourier transform A(j,k) of the composite image is $$A(j,K) = \sum_{i=1}^{N_c} \sum_{m=-\frac{N_\Phi}{2}}^{\frac{N_\Phi}{2}} \sum_{l=-\frac{N_r}{2}}^{\frac{N_r}{2}} b_i(l,m) v_i(j-l, k-m) \quad (5)$$

where $v_i(j,k)$ is a matrix of NMR voltages measured on coil i and $b_i(j,k)$ is the discrete Fourier transform of the field map from coil i. The first and second arguments are the sample indices in the readout and phase encode directions, respectively, and $N_r$ and $N_\Phi$ are the number of samples in the readout and phase encode directions, respectively.

At first glance, equation (5) which combines the data in the time domain does not appear to offer any computational advantages over equation (3) which combines the data in the image domain. According to equation (5), the total number of operations required to obtain a single k-space data point of the composite image is proportional to the number of pixels N in the image, where $N = N_\Phi \times N_r$. Thus, the number of operations required to construct the entire k-space representation of the composite image scales is a factor of $N^2$. So, for large values of N, combining the data in image space rather than in time space would appear to require far fewer computations. This is because the data from each coil channel is subjected to Fourier transformation at 19 (FIG. 1) before combining as a simple weighted sum at 20, and the number of operations for a Fast Fourier transform (FFT) scales as a factor of $N \log(N)$ rather than $N^2$.

The number of computations required for the convolution can be greatly reduced, however, through the recognition that the RF field map 21 (shown in FIG. 1) are relatively slowly varying quantities across the image and can thus be suitably represented in abbreviated form for time domain processing purposes. It has been observed that the inverse Fourier transform of the field map is concentrated near the origin in the time domain (k-space) and thus the $b_i(l,m)$ terms in equation (5) can be truncated to a kernel containing relatively few terms.

Figure 2:
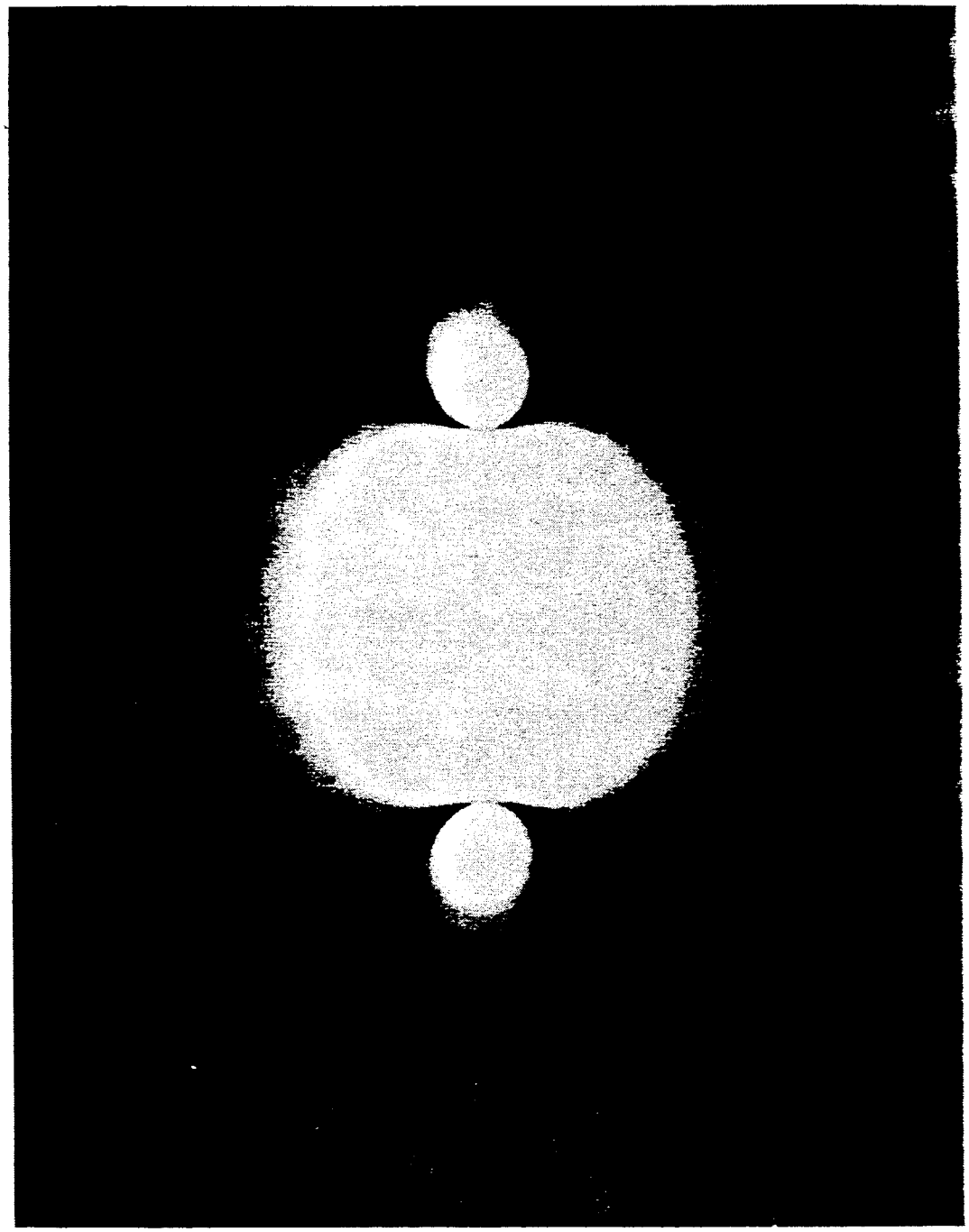
FIG. 2 is a field map sensitivity profile of a representative surface coil in the arrangement of FIG. 1.
Figure 3:
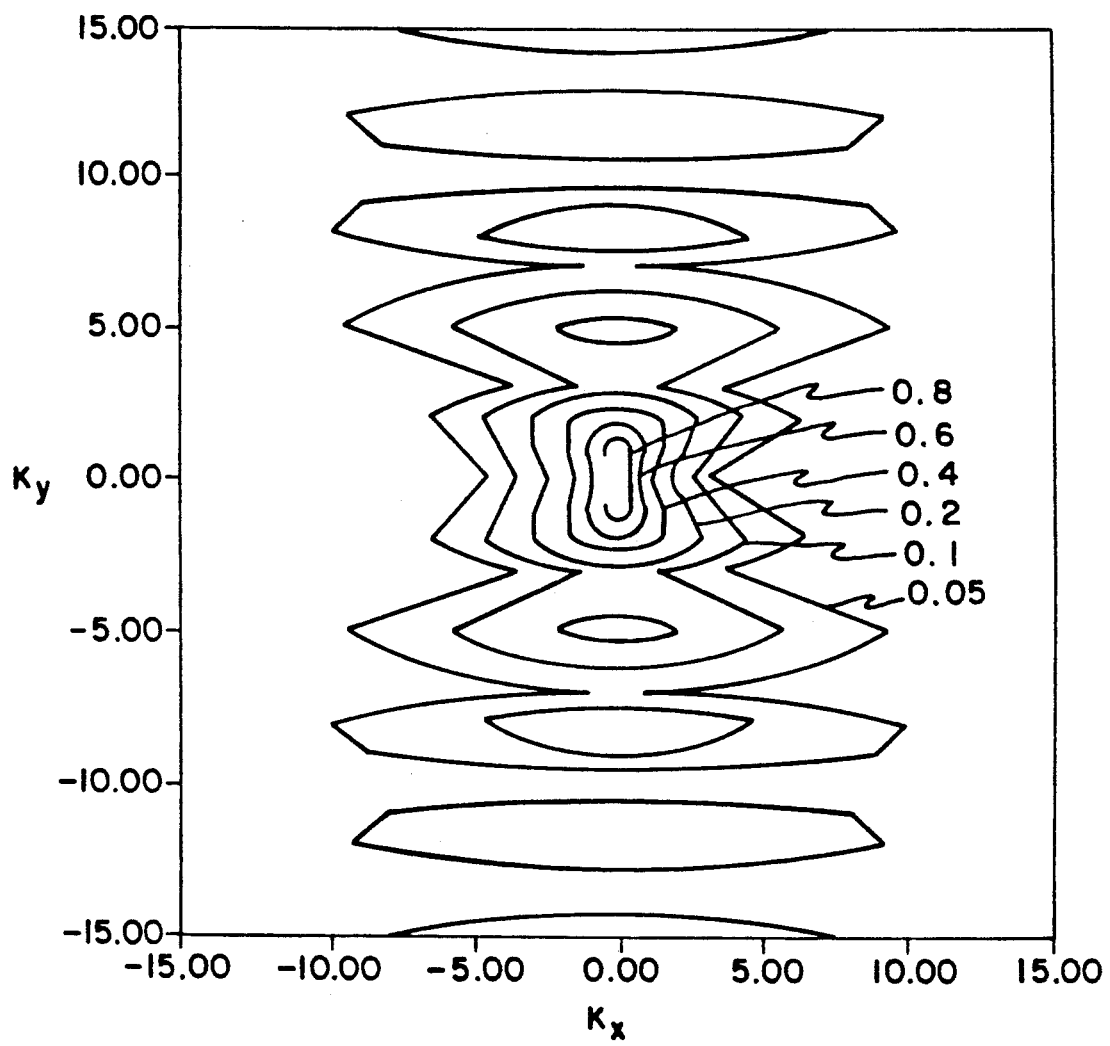
FIG. 3 is a magnitude contour plot of the time domain or k-space representation of the field map of FIG. 2.
Figure 4:
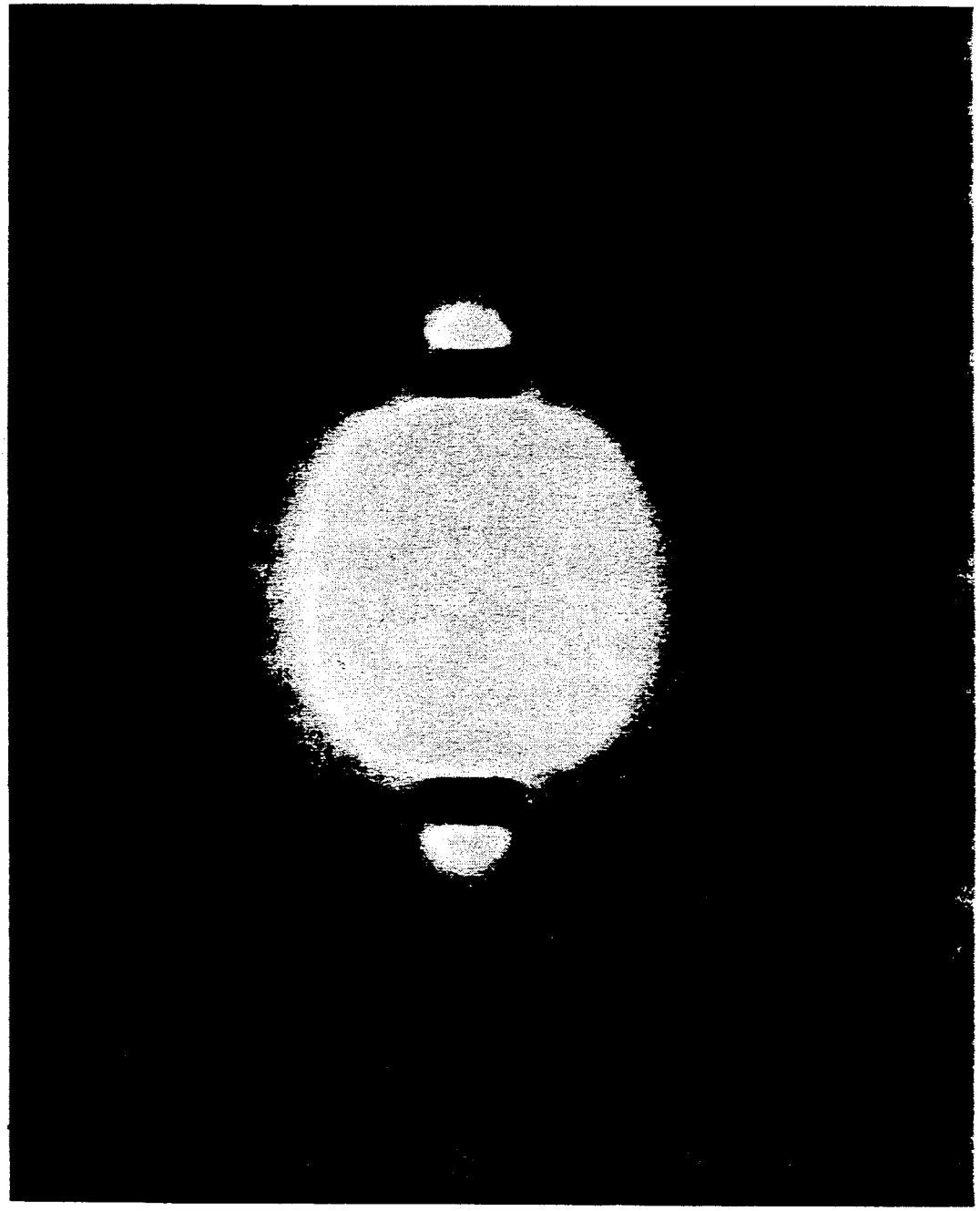
FIG. 4 is a filter function derived for the coil of FIG. 2 after Fourier transformation into image space of the truncated representation of FIG. 3.

By way of example, FIG. 2 shows the magnitude of a calculated sensitivity profile of a typical surface coil. The calculation is for a 40 cm FOV with a 12 cm square loop RF receiving coil located in a plane perpendicular to the image. The main magnetic field is horizontal. The magnitude of its corresponding inverse Fourier transform is shown in FIG. 3, which is a contour plot of the k-space representative of the field map of FIG. 2. The constant contours are designated by arbitrary numerical units scaled to a maximum of 1.0, with the maximum being at the origin. Only the center $31 \times 31$ pixels of the magnitude are shown. Although the sensitivity profile (FIG. 2) occupies about 24% of the image FOV, the k-space representation (FIG. 3) has significant magnitude contribution only in the center few pixels. FIG. 4 shows the construction of a filter function profile corresponding to the sensitivity profile of FIG. 2, after truncating the filter coefficient of FIG. 3 by setting the magnitudes of the k space representation of FIG. 3 to zero outside the central $9 \times 9$ pixel matrix of points, placing a Hamming window (see, R. W. Hamming, *Digital Filters* [Hall] pp. 102-105) around the data to avoid ringing, and then Fourier transforming the result into image space. A visual comparison of the derived filter function profile of FIG. 4 with the original profile of FIG. 2 shows little qualitative difference, except near the coil wires themselves. This indicates that a kernel of $9 \times 9$ pixels is sufficient to give a good reconstruction. The error near the wires (located at the intersection of the side lobes and the central region of sensitivity) occurs because the RF magnetic field varies rapidly there and thus contains high spatial frequencies. Away from the coil, the RF field varies slowly and the $9 \times 9$ filter kernel matches the profile well.

Using truncated convolution kernels to represent the field maps in k-space greatly reduces the number of operations necessary for effecting the convolution from one that scales as a factor of $N^2$ to one that scales as a factor of $NN_k$, where $N_k$ is the number of coefficients in the filter kernel (e.g., 81 for the $9 \times 9$ matrix above). Except for an arbitrary constant, the truncated convolution scales the same as the FFT.

FIG. 5 shows a system and process in accordance with the invention for combining the separate coil data from an NMR array to obtain a composite image with good SNR resolution in the time domain, using the above filtering technique. The front end of each coil channel 14' has its own receiver 15 and A/D circuitry 16 for receiving and digitizing the separately received signal, the same as for the corresponding channels 14 of the image domain processing set-up of FIG. 1. But instead of storing the separate NMR images of each channel in a separate memory location 18 and Fourier transforming at 19 prior to summing, as done in the system of FIG. 1, the arrangement of FIG. 5, in accordance with the invention, filters the data with a field map filter 23 as it is acquired, and then sums the filtered data at summation means 20' prior to storing a pretransformation combined image in a memory 24. A single Fourier transformation is then undertaken by fast Fourier transformation means 25 to give the final composite image. The filters 23 provide the weighting necessary for summing the separate contributions from the channels 14' to give a good SNR resolution in the end image. The filters 23 perform the operations defined by equation (5). In contrast to the image domain data combination method employed by the system of FIG. 1, only one (or, possibly, two to obtain a uniform noise image) Fourier transformation is required at the end of the scanning operation to produce the combined image. Thus the time domain filtering scheme of FIG. 5 avoids the large time delays from end-of-scan to first image appearance inherent in the process employed by the system of FIG. 1. Moreover, the transformation process for the arrangement shown in FIG. 5 is independent of the number of coils utilized. Also, in contrast to the FIG. 1 image domain approach, the time domain method employed by the system of FIG. 5 of the invention has the additional advantage that the data is combined in real time, as it is being collected, thereby reducing the data storage capacity necessary for each coil channel.

System Architectures

Various system architectures are possible for implementation of the time domain image reconstruction method of the invention. If the k-space representation (FIG. 3) of the field map for each coil 12 is reduced to a kernel size of $N_{cr} \times N_{c\Phi}$ in the readout and phase encode directions (see FIG. 4), the k-space representation of the composite image may be given by $$A(j,k) = \sum_{i=1}^{N_c} \sum_{m=-\frac{N_{c\Phi}}{2}}^{\frac{N_{c\Phi}}{2}} \sum_{l=-\frac{N_{cr}}{2}}^{\frac{N_{cr}}{2}} b_i(l,m) v_i(j-l, k-m) \quad (6)$$

According to equation (6), each data point from each coil 12 contributes to a rectangular subregion of the composite k-space matrix. This relationship is shown pictorially in FIG. 6.

Figure 6:
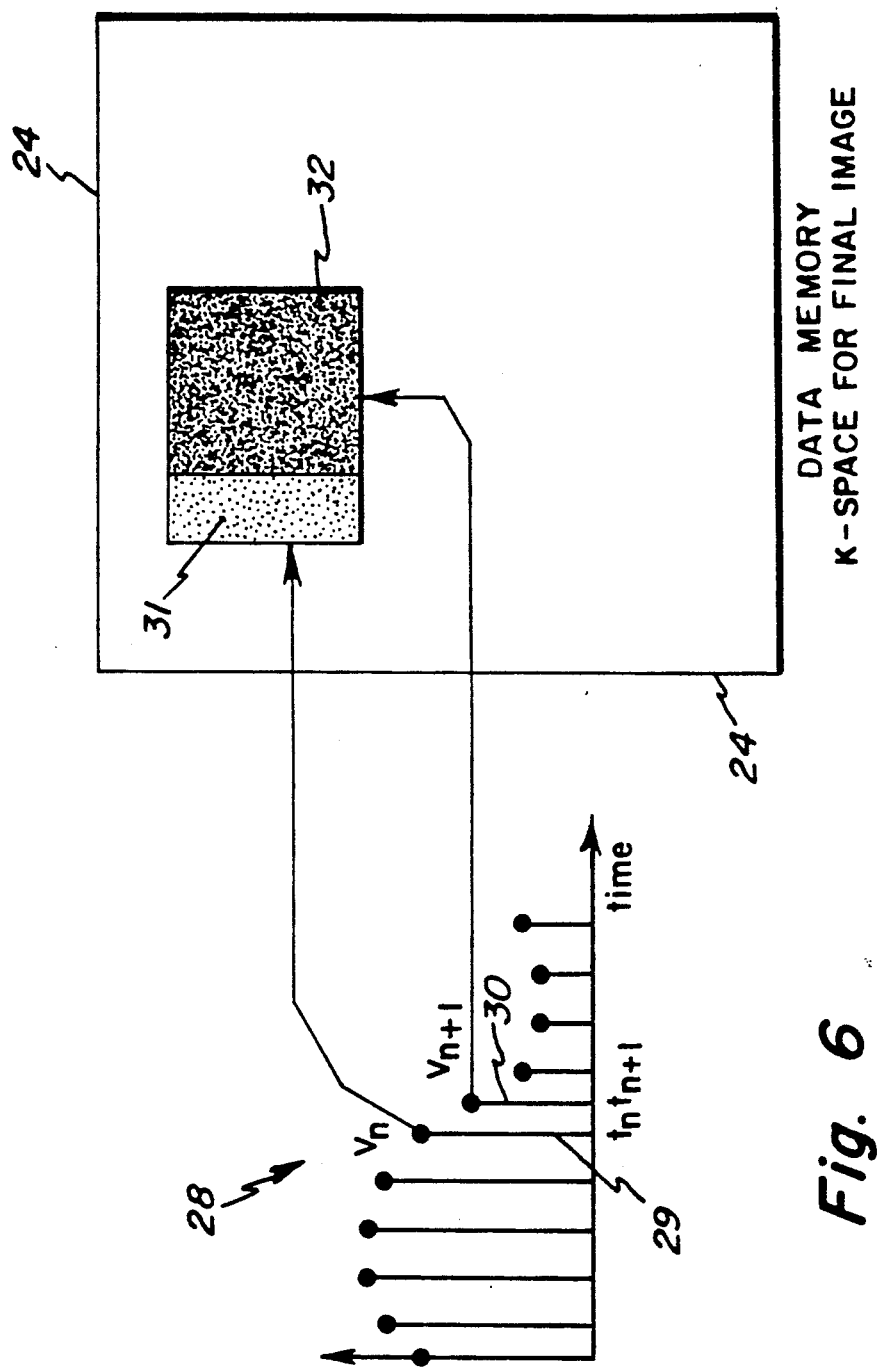
FIG. 6 is a pictorial representation of truncated convolution in the arrangement of FIG. 5 for a two-dimensional single slice image.

FIG. 6 is a pictorial representation of truncated convolution for a two-dimensional single slice image. The digitized signal 28 from a single coil 12 has a number of data points 29, 30 of magnitude $V_n$, $V_{n+1}$, etc., corresponding to samplings of the analog voltage signal 28 taken at successive time intervals $t_n$, $t_{n+1}$, etc. The data from each coil 12 contributes to a rectangular region in the composite k-space (time domain) matrix. The size of the rectangular region is $N_{c\Phi} \times N_{cr}$. As each new data point enters, the subregion moves in the readout direction by one pixel. The signal 29 from time tn contributes to a rectangular subregion 31, and the signal 30 from time $t_{n+1}$ contributes to a rectangular subregion 32 shifted in the data memory 24 in the readout direction by one column. For each new phase encode step, the region moves down by one row.

Figure 7:
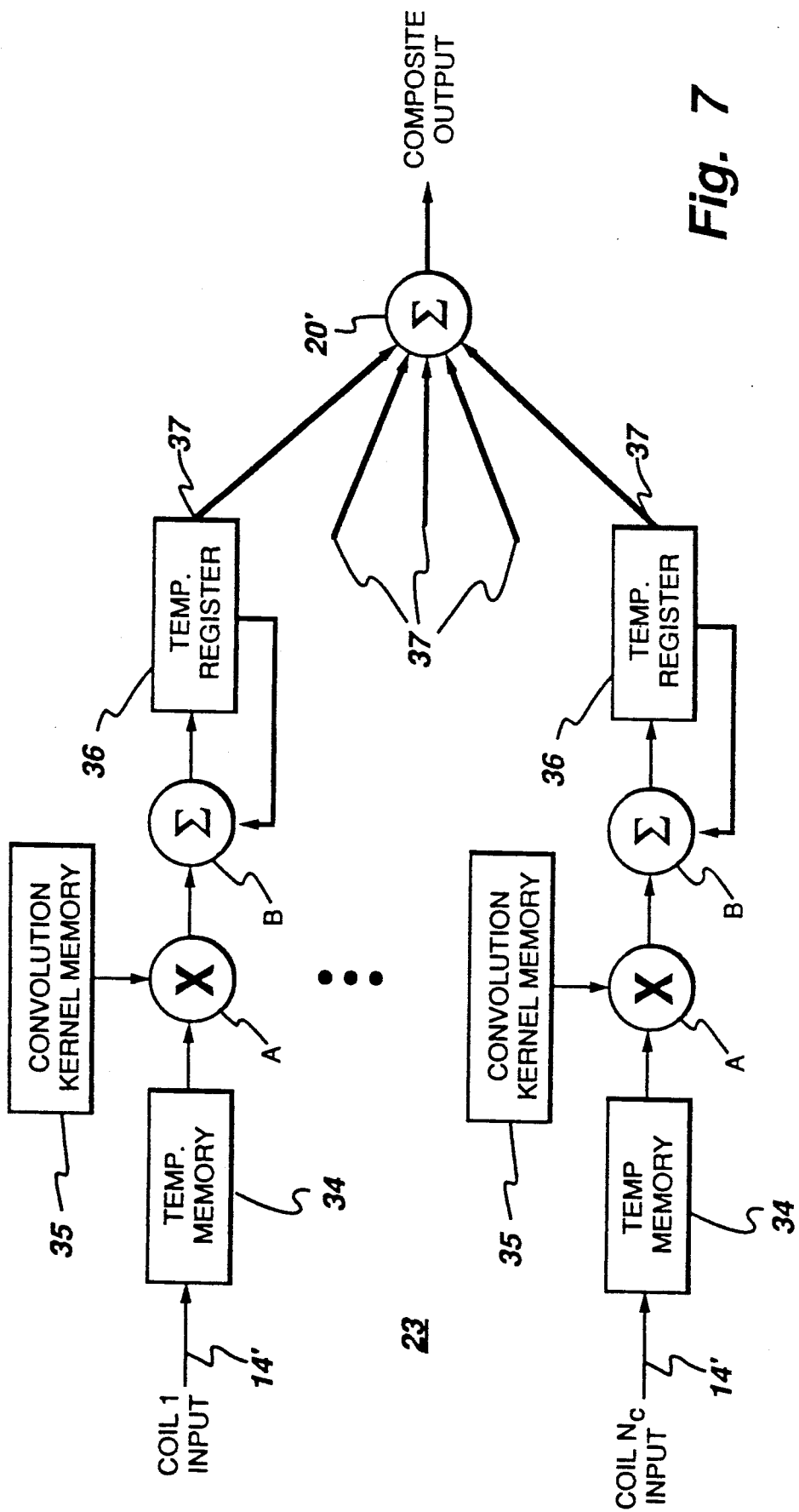
FIG. 7 is a view showing a direct implementation of the convolution sum given by equation (6), below.

A straightforward hardware embodiment of filter 23 for implementation of equation (6) is depicted in FIG. 7. The arrangement uses discrete components and needs a modest amount of memory to temporarily save the most recent $N_{c\Phi} \times N_r$ data points from each slice, echo and coil. The multiplication element A performs the multiplication in equation (6). The two innermost summations of equation (6) are done by summation element B and the temporary register 36. The outermost sum is performed by summation element 20'. For each coil channel 14', a temporary storage memory 34 is connected to receive the digitized output signal of the associated coil 12. The memory 34 functions to save the data points 29, 30 for the successive time increments tn, tn+1, etc., until a sufficient amount of data is accumulated to complete one i,k point in the composite matrix. Assuming that k-space is covered in a linear fashion, this occurs during the $N_{c\Phi}$'th phase encode step. As each subsequent data point enters from the left (viz., at the input end), the appropriate $N_{cr} \times N_{c\Phi}$ data is extracted from filter memory 34 and is multiplied by the corresponding filter coefficients stored in a convolution kernel memory 35, summed by use of a temporary register 36, and then sent to an output port 37 as a weighted input to the composite summation means 20'. To avoid overflow of the input memory 34, a line of readout data must be completed and sent to the output port for each new line that enters. To accommodate multi-slice data, the memory must save the most recent $N_{c\Phi} \times N_r$ data points from each slice and echo.

One of the disadvantages of the architecture of FIG. 7 is that each coil requires a significant amount of fast memory. The depicted memory 34 for each coil channel 14' has a size of $N_r \times N_{cr} \times N_e \times N_s \times 4$ bytes, where $N_r$ is the number of readout points, $N_{cr}$ is the number of filter points in the phase encode direction, $N_e$ is the number of echoes, and $N_s$ is the number of slices. The convolution kernel memory 35 has a memory size of $N_{cr} \times N_{c\Phi} \times N_s \times 4$ bytes, where $N_{c\Phi}$ is the number of filter points in the phase encode direction. To keep up with the incoming data, the memory should operate at a rate that is $N_{cr} \times N_{c\Phi}$ faster than the entering data.

Assuming a 100% duty cycle, 512 readout points, an 8 msec readout time and a 16×16 convolution kernel, the temporary storage memory data rates should be 16 MHz. A 32×32 point kernel would require a 64 MHz rate.

Figure 8:
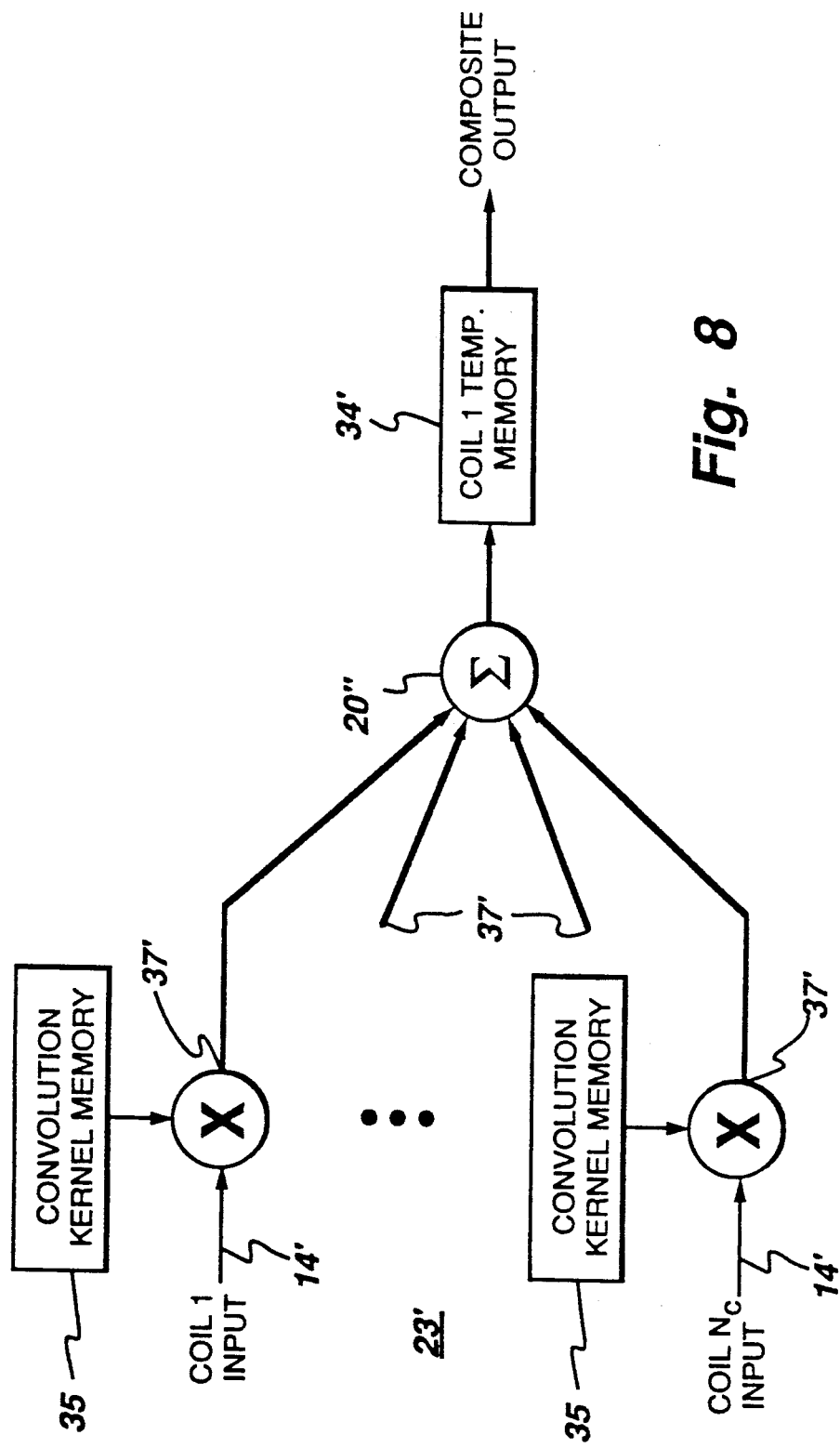
FIG. 8 shows an alternative embodiment of the implementation shown in FIG. 7.

By changing the order of operations, the total amount of memory can be reduced without increasing the speed requirements. FIG. 8 shows one possible implementation of this. Raw digitized time domain data received from each coil 12 is operated on immediately as it enters from the left or input side of channel 14'. As each data point enters, it is multiplied by a total of $N_{cr} \times N_{c\Phi}$ different filter coefficients from the convolution kernel memory 35. The results of these multiplications are delivered on inputs 37' to be summed at summation means 20'' over the coils 12 and then added to an output memory 34' in a read-modify-write fashion. As with the arrangement shown in FIG. 7, the data rates to and from the filter memory 35 and output memory 34' should be $N_{cr} \times N_{c\Phi}$ times the incoming data rate.

In the system of FIG. 8, the output memory 34' is chosen to be a different element than that of the total composite memory 24 (FIGS. 5 and 6). In principle, those memories could be constituted by the same physical memory, but splitting the memory into two sections may have cost advantages. A faster memory 34' at the output of summation means 20'' is usually more expensive, but less of it is needed compared to the composite memory 24 (shown in FIG. 5).

Figure 9:
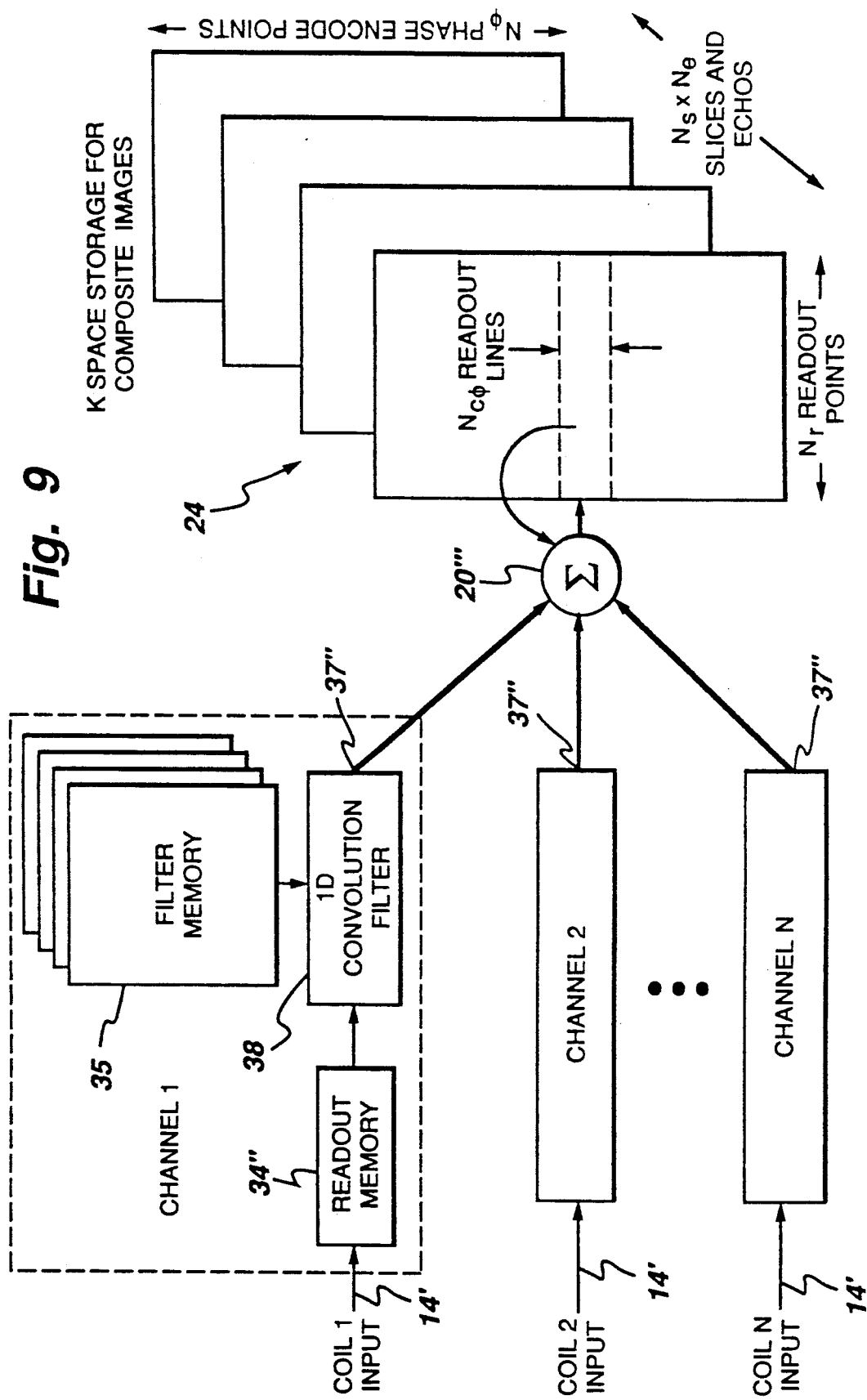
FIG. 9 shows time domain filtering of multi-slice/multi-echo data using one-dimensional filter convolutions.

The architectures shown in FIGS. 7 and 8 do not exploit any special purpose filter chips that might be available. A number of companies make chips that compute one-dimensional convolutions very efficiently, and it may be desirable to utilize such chips to make a compact and efficient filter. FIG. 9 shows one way of breaking the two-dimensional filter 23 (shown in FIG. 5) into a series of one-dimensional filters. If this is done, the data rate into memory can be reduced by a factor of $N_{c\Phi}$, the number of convolution filter points in the phase encode direction. For each coil 12, a line of data in the readout direction is passed through a one-dimensional convolution filter 38 a total of $N_{c\Phi}$ times. Each pass through the one-dimensional filter utilizes a different set of filter coefficients obtained from the filter memory and corresponds to the multiplication and innermost summation of equation (6). The outermost sum of equation (6), the sum over the coils, is produced by summation means 20'''. Summation means 20''' also performs an addition for the read-modify-write operation which is equivalent to the second summation in equation (6). The signals at the outputs 37'' of the filters are summed by summation means 20'''', and the results are added to the k-space storage memory 24 for the composite images. For each readout line that enters from the left or input side, $N_{c\Phi}$ readout lines in the composite stage memory 24 are modified. The same hardware can be used to combine three-dimensional data simply by changing the order in which data is read out of filter memory, and the order in which the results are added to the composite memory.

One proposed digital signal processing chip employs 32 multipliers that operate in parallel and can convolve a 16 bit-by-16 point complex kernel with a 16 bit data path at a rate of 800 ns per complex I/Q pair. For multi-slice data requiring a 16 point-by-16 point kernel and acquired at a 100% duty cycle, this corresponds to a maximum digitization rate of 12.8 μsec. For conventional multi-slice imaging, 512 complex I/Q pairs can be typically acquired in 8 msec or 16 μsec per point. Thus, it can be seen that a single filter chip may be sufficient for each coil channel 14', with some spare for overhead such as reloading the filter coefficients.

For three-dimensional and high speed imaging, a number of chips would have to be placed in parallel to keep up with the data rates. An alternative approach for high speed imaging is to trade off the average rate with the instantaneous rate. Generally, high speed imaging uses small matrix sizes because of poor SNR. It may therefore be more cost effective to add a modest amount of memory at the input of the filters instead of coupling too many filter chips in parallel. The memory could then be filled at a high instantaneous burst rate and emptied at a reduced average rate, giving the system time to filter the data.

For three-dimensional imaging, the incoming data rates are the same as for multi-slice data, but another dimension of filtering is required. Since the data is acquired over many minutes with nearly 100% duty cycles, huge amounts of data are processed. It is therefore not practical to place temporary memory in front of each filter, and thus the data must be combined as fast as it enters. A three-dimensional image with 512 readout points and an 8 msec readout time would require 16 filter chips to keep up with the incoming data rate. A reduction in the filter kernel from 16 to 8 in the two phase encoding directions changes the data rate through the filter by a factor of four and this only four chips would be required. This may cause some degradation in the SNR (initial indications are not much) but the SNR will still be better than one could obtain without using the phased array.

EXAMPLE

A four-coil array was used to demonstrate the methods for single slice saggital imaging of the human spine. The array was made of 12 cm coils overlapping in a row in a manner similar to that shown in FIG. 4 of the '162 patent. The four coils 12 were placed beneath the patient in a linear array running in the vertical direction. Each coil 12 had its own receiver and digitizer. The image FOV was 40 cm with a composite matrix size of 512×512 pixels. After the data was separately collected, it was combined in the time domain with filter kernel sizes ranging from 1×1 (a simple sum) to 9×9. For comparison, the data was also combined in the image domain.

Figure 10A:
FIGS. 10A, 10B, 10C and 10D are views of exemplary reconstructions in the image space (FIG. 10A) and time domain space (FIGS. 10B–10D), respectively, showing the effect of filtering in accordance with the method of the invention.

Following the general procedure described in the '162 patent, the data from each coil was combined in the image domain by separately Fourier transforming the data from each coil 12, weighting each image by its corresponding field map image, and then summing the results. The image was then normalized into a uniform sensitivity image. FIG. 10A shows the resultant 512×512 saggital image of the spine.

To combine the data in the time domain utilizing the method of the present invention, the filter coefficients were determined by calculating the complex field map (magnitude and phase) for each coil over the full 512×512 image matrix. Expressions for the field maps were obtained by integrating the Biot-Savart Law over a conductor placed at the centerline of the coil. The complex field map for each coil was then inverse Fourier transformed into k-space and truncated to the desired size. To avoid ringing in the image, the resultant filter coefficients were windowed in two dimensions with a Hamming window of the type described in R. W. Hamming, *Digital Filters,* supra.

To avoid interference patterns in the image, the raw data was corrected for the different phases and gains of the NMR receiving channels. To do this, a transmit loop approximately 2 cm in diameter was placed about 4 cm above each surface coil. The transmit loop was driven from the local oscillator used by the NMR receivers and this was phase-locked to the receiver. The resultant signal amplitude and phase measured at the output of the receivers were used to calibrate each channel.

Using equation (6), the truncated filter kernel was then convolved with the phase corrected NMR data. The results were then summed over the coils and Fourier transformed. To obtain a uniform sensitivity image, the filter kernel was convolved with the conjugate of the filter kernel and summed over the coils. This normalization map was also Fourier transformed and divided pixel-by-pixel into the image.

Figure 10B:
Figure 10C:
Figure 10D:

FIGS. 10B, 10C and 10D show the results of a simple sum, a 5×5 point and 9×9 point kernel. The simple sum image (FIG. 10A) corresponds to an image obtained using a single large coil. As expected, the simple sum image had poor SNR (approximately two times lower than the point-to-point weighted sum image of FIG. 10A) and poor suppression of motion and wraparound artifacts. The 5×5 kernel image showed significant improvement. The 5×5 image (FIG. 10C) was developed by passing the time dependent data from each coil 12 through a two-dimensional filter with a 5×5 kernel before summing. A faint wraparound artifact is visible at the top. The 9×9 image (FIG. 10D) was constructed similarly using a 9×9 kernel. The 9×9 result had almost the same quality as the composite image (FIG. 10A) developed using the image domain techniques, except for minor differences near the edges of the image.

The differences of the edges between the images obtained using time domain (FIGS. 10B and 10D) and image domain (FIG. 10A) methods are due to the wraparound of the filter. Ideally, the filter corresponding to the coil at the bottom of the image should have no significant contribution at the top of the image. However, a 9×9 filter can be made to roll off in only about 1/9th of the image FOV and, thus, some wraparound is unavoidable. Combining the data in the image domain, however, allows one to filter to the nearest pixel or 1/512 of the image FOV. To obtain exactly the same result in the time domain would required a 512×512 filter kernel.

In the above example, the filter coefficients were determined for the time domain filter hardware by calculating the RF magnetic field for each pixel in each slice for each coil. The results were then Fourier transformed, truncated, and then windowed. This method may not be fast enough, however, to be practical in the clinical environment. The filter coefficients are a function of the slice position and the operator of the NMR imaging system selects the slice orientation and the number of slices on a patent-by-patient basis. Within a minute or two after the selection, the NMR instrument needs to be ready to take data. Using the method of the example, to determine the coefficients for 30 slices of 512×512 pixel images using the four-coil array, 120 two-dimensional 512×512 complex inverse Fourier transforms would be required. If each transform takes 3 seconds on an array processor, this part of the computation would take 6 minutes. The calculation of the magnetic fields would probably add a few more minutes, thus creating a built-in delay of about 10 minutes, which might be unacceptable. A more rapid means of calculating the filter coefficients from the known positions or the RF receiving coils may be needed.

There are a couple of approaches to speeding up the process of filter calculation. One approach is to precalculate and store filter coefficients for common slice locations, but this might be too restrictive. Another approach involves a Fourier transform on a smaller grid. Since the resultant set of filter coefficients in k-space will be truncated, it is not necessary to sample the RF magnetic field at each and every pixel in the image before inverse Fourier transformation. The matrix size for coefficient calculations can thus be reduced from, say, 512 to perhaps 50 or fewer pixels. In the above 30 slice calculation, this would decrease the time by a factor of 100.

A further approach involves the determination of the full three-dimensional representation of a particular coil's RF magnetic field for a known position of the coil. This is done for each vector component, i.e., $B_x$, $B_y$, and $B_z$, of the magnetic field. Each component of the RF magnetic field is then inverse Fourier transformed, truncated, and saved on disk for later use. Since rotations in real space are simple rotations in k-space and translations in real space are phase shifts in k-space, the set of filter coefficients can be derived for any coil location or orientation from this original stored set. For three-dimensional imaging, the field maps can be simply rotated and translated in k-space and then windowed to the desired size. For multi-slice data, the three-dimensional k-space data can be first rotated and then translated according to the slice position. The data can then be collapsed into two dimensions before windowing. Such methods involve relatively simple operations on small matrices, so they can be accomplished quickly.

In yet another approach, the NMMR image data itself can be used as the basis for determination of the filter coefficients. This is analogous to a sum-of-squares image approach and relies on the fact that the image itself is a measure of the coil sensitivity. By acquiring the center of k-space first, the raw data itself (actually its conjugate) becomes the filter coefficient for each channel.

There has thus been described a method for combining the data from the separate coil channels of an NMR phased array in the time domain using filters to produce a composite image having high SNR throughout the image. When compared with methods that combine the data in the image domain, substantial reductions in the reconstruction time and the amount of memory required in the NMR imaging system are realized. In this way, systems using many coils can be made more practical.

Those skilled in the art to which the invention relates will appreciate that other substitutions and modifications can be made to the described embodiment without departing from the spirit and scope of the invention as described by the claims below.

What is claimed is:

1. A method for combining NMR response data of a sample from a plurality of RF receiver coils of an NMR phased array in the time domain to form a composite NMR image, comprising the steps of:

(a) receiving at each of the RF receiver coils a different one of a plurality of NMR response signals, each of the signals being evoked from a portion of the sample within a field of view of a respective one of the receiver coils;

(b) conditioning each of the response signals develop a plurality of data point signals corresponding to the magnitude of each of the respective response signals from each of the receiver coils at successive time intervals;

(c) convolving each of the data point signals by a time domain representation of a field map of the respective one of the receiver coils generating the corresponding one of the response signals; and (d) combining the signals obtained by the step of convolving on a time domain point-by-point basis to produce a time domain representation of the composite NMR image of the sample.

2. The method of claim 1 wherein adjacent ones of the response coils have overlapping fields-of-view.

3. The method of claim 2 wherein the response coils have substantially zero interaction.

4. The method of claim 1 wherein the step of receiving includes the step of detecting each of the response signals from each respective one of the receiver coils substantially simultaneously.

5. The method of claim 1 wherein the step of conditioning includes the step of digitizing each of the response signals to form a plurality of different series of discrete ones of the data point signals.

6. The method of claim 5 wherein the step of convolving includes the step of reducing each time domain representation to a central kernel size.

7. The method of claim 6 wherein the step of convolving is performed in accordance with the relationship:

$$A(t_r, t_\phi) = \sum_{i=1}^{N_c} \int_{-\infty}^{+\infty} \int_{-\infty}^{+\infty} b_i(\tau_r, \tau_\phi) v_i(t_r - \tau_r, t_\phi - \tau_\phi) d\tau_\phi d\tau_r.$$

8. The method of claim 1 wherein the step of convolving includes the steps of obtaining an initial NMR image representation of the sample from each of the RF receiver coils and substituting the initial NMR image representation for the time domain representation of each receiver coil.

9. The method of claim 1 wherein the NMR composite image comprises a spectroscopic image of the sample.

10. A method for combining NMR response data from receiver coils of an NMR phased array in the time domain using filtering to form a composite NMR image having good overall SNR resolution, comprising the steps of:

(a) providing a plurality of closely-spaced RF receiver coils, with adjacent coils having overlapping fields-of-view and substantially no interaction;

(b) substantially simultaneously receiving at each one of the coils a different one of a plurality of NMR response signals, each evoked from a portion of the sample within the field-of-view of that coil;

(c) digitizing the response signal of each coil to provide a plurality of different series of discrete data point signals corresponding to the magnitudes of the response at successive time intervals for each coil;

(d) temporarily storing an m×1 number of said data point signals of each of the series of signals;

(e) multiplying the temporarily stored signals by a corresponding m×1 number of signals digitized time domain representation of a field map of the coil associated with the series reduced to a central m×1 kernel size; and (f) combining the multiplied temporarily stored signals of each coil, on a time domain point-by-point basis, to produce a composite NMR image of the sample.

11. Apparatus for receiving and combining NMR response data from a plurality of RF receiver coils of an NMR phased array to form a composite NMR image of a sample, comprising:

a plurality of receiver circuits each connected to a respective one of the coils for receiving a corresponding NMR response signal, each response signal being evoked from a portion of the sample within the field-of-view of the response one of the coils;

an analog-to-digital converter connected to each receiver circuit for providing a series of discrete digital signals corresponding to a succession of time space data points representative of the response signals from each one of the coils;

means associated with each coil for providing an m×1 number of digitized signals corresponding to the digitized time domain representation of a field map of the associated coil reduced to a central m×1 kernel size;

means connected to each converter and to said means associated with each coil for temporarily storing each last m×1 number of said series of discrete digital signals;

means for convolving each series of discrete digital signals with said digitized signals of said time domain representation of each field map to provide a convolved signal series; and means connected to said temporary storing means for combining said convolved series to provide a time domain representation of a composite NMR image of the sample.

* * * * *